United States Patent [19]

Yablonovitch

[11] Patent Number: 5,172,267
[45] Date of Patent: Dec. 15, 1992

[54] OPTICAL REFLECTOR STRUCTURE, DEVICE, METHOD OF FABRICATION, AND COMMUNICATIONS METHOD

[75] Inventor: Eli Yablonovitch, Leonardo, N.J.

[73] Assignee: Bell Communications Research, Inc., Livingston, N.J.

[21] Appl. No.: 633,405

[22] Filed: Dec. 21, 1990

[51] Int. Cl.$^5$ ............................................... G02B 5/12
[52] U.S. Cl. ..................................... 359/515; 359/896; 359/838; 359/900
[58] Field of Search ............... 359/515, 896, 350, 838, 359/116, 900, 263, 584, 572

[56] References Cited

PUBLICATIONS

E. Yablonovitch et al., "Photonic Band Structure: The Face-Centered-Cubic Case," *Physical Review Letters*, Oct. 1989, vol. 63, pp. 1950–1953.

E. Yablonovitch, "Inhibited Spontaneous Emission in Solid-State Physics and Electronics," *Physical Review Letters*, May 1987, vol. 58, pp. 2059–2062.

*Primary Examiner*—Loha Ben
*Attorney, Agent, or Firm*—Leonard Charles Suchyta; Charles S. Guenzer

[57] ABSTRACT

An omnidirectional optical reflector structure (41, 52, 61) is made by forming a plurality of holes in a solid body (11) so as to result in a face-centered cubic lattice. Conveniently, the desired structure can be made by three successive steps of microfabrication, e.g., in the presence of a mask layer (12). Preferred reflector structures can be used, e.g., as external mirrors as filters, and as cavity materials of communications lasers with improved signal-to-noise ratio.

23 Claims, 3 Drawing Sheets

OPTICAL REFLECTOR STRUCTURE, DEVICE, METHOD OF FABRICATION, AND COMMUNICATIONS METHOD

TECHNICAL FIELD

The invention is concerned with devices including a structure for reflecting electromagnetic radiation.

BACKGROUND OF THE INVENTION

Optical reflector structures, e.g., mirrors, gratings, and layered structures are of obvious importance in the field of optics in general, and such structures are being developed further for optical communications and information processing applications. In particular, for example, reflector structures are used in lasers, e.g., fiber-optics and integrated-optics communications lasers. Preferably, such lasers are designed for maximized stimulated emission and minimized spontaneous emission, and reflector structures are sought which contribute to these goals.

It has been recognized that spontaneous emission is diminished in omnidirectional reflector structures which form a three-dimensionally periodic, face-centered cubic lattice. As disclosed by E. Yablonovitch, "Inhibited Spontaneous Emission in Solid-State Physics and Electronics", Physical Review Letters 58 (1987), pp. 2059-2062, such a structure can be made by successive layer deposition on a corrugated surface having a checkerboard pattern, the resulting structure being composed of cube-shaped elements or "atoms". Alternatively, as disclosed by E. Yablonovitch et al., "Photonic Band Structure: The Face-Centered-Cubic Case", Physical Review Letters 63 (1989), pp. 1950-1953, such a structure may be composed of a face-centered-cubic lattice of spheres.

While, conceptually, face-centered cubic lattices of cubes or spheres may appear as the simplest, they have been found difficult to implement, and their performance has not met expectations. The invention described below is motivated by the desire for a face-centered-cubic structure which is more readily manufacturable and which is highly effective as an omnidirectional reflector.

SUMMARY OF THE INVENTION

For electromagnetic radiation, e.g., visible, ultraviolet, or infrared light, a reflector structure is made by forming a plurality of holes, passages, or channels in a solid body. Preferred passages intersect by threes and impart face-centered cubic structure to the solid body.

Preferred reflector structures can be used as device elements, e.g., as external mirrors or to provide feedback in an optical cavity. When such a structure is used to make an optical communications laser, a transmitter with improved signal-to-noise ratio can be realized.

DETAILED DESCRIPTION

Figure 1:
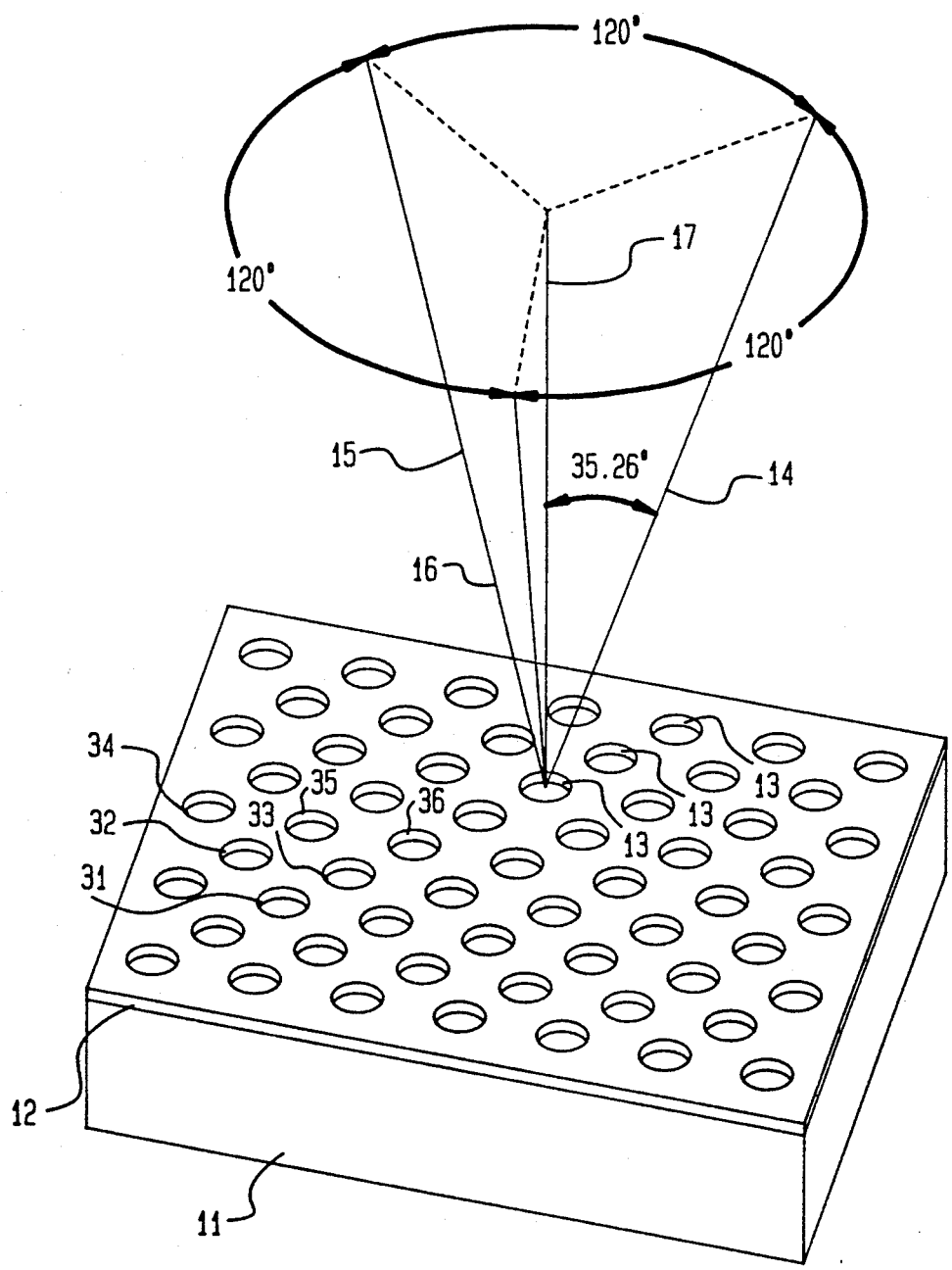
FIG. 1 is a schematic perspective representation of a material body processed in accordance with a preferred method in accordance with the invention.

FIG. 1 shows body 11 and, on a nominally planar surface of body 11, a patterned mask layer 12 which leaves uncovered a regularly triangular array of surface sites 13. For example, as shown, such sites may be circular. The material of mask layer 12 may be chosen to protect underlying surface portions of body 11 during microfabrication, e.g., by reactive-ion etching. Shown associated with one site 13 are lines 14, 15, and 16, each forming the same preferred polar angle with a line 17 perpendicular to mask layer 12. Nominally, such polar angle is the trigonometric inverse-tangent of $2^{-\frac{1}{2}}$; thus, such angle is approximately equal to 35.26 degrees. Furthermore, azimuthal angles between lines 14 and 15, 15 and 16, and 16 and 14 are 120 degrees nominally. Also identified in FIG. 1 are sites 31-36 as further described below with reference to FIG. 3.

Preferred processing in accordance with an aspect of the invention involves forming, at each site 13, three intersecting holes, channels, or passages essentially straight into or through body 11, such three holes being formed in the directions defined by lines 14, 15, and 16. On a sufficiently large scale, holes can be formed by mechanical drilling or machining; more typically, in microfabrication, lithographic or direct-writing methods may be used, e.g., reactive ion etching or ion milling. In such fabrication, nominal preferred directions may be realized to within a fraction of a degree.

Figure 2:
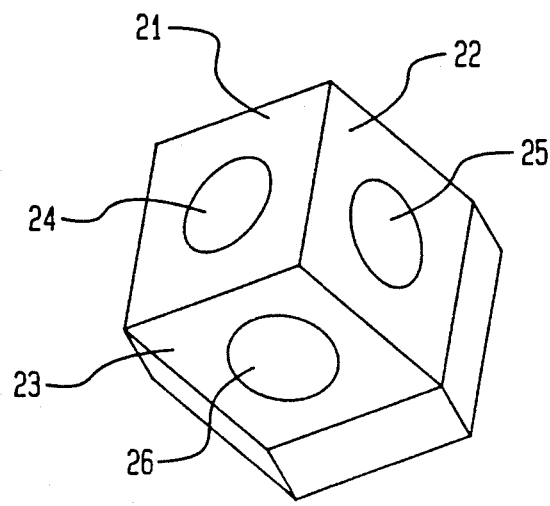
FIG. 2 is a perspective representation of a real-space unit cell (Wigner-Seitz primitive cell) of a preferred structure in accordance with the invention.

In accordance with an aspect of the invention, a structure made as described can be identified as a face-centered-cubic lattice, consisting of a close-packed plurality of unit cells or "atoms" as depicted in FIG. 2. As shown, a unit cell takes the form of a regular rhombic dodecahedron having pair-wise adjoining facets 21, 22, and 23 with holes 24, 25, and 26 perpendicular to respective facets 21, 22, and 23. Holes 24, 25, and 26 intersect at the center of the unit cell, and they exit perpendicularly through three unseen bottom facets of the unit cell.

Figure 3:
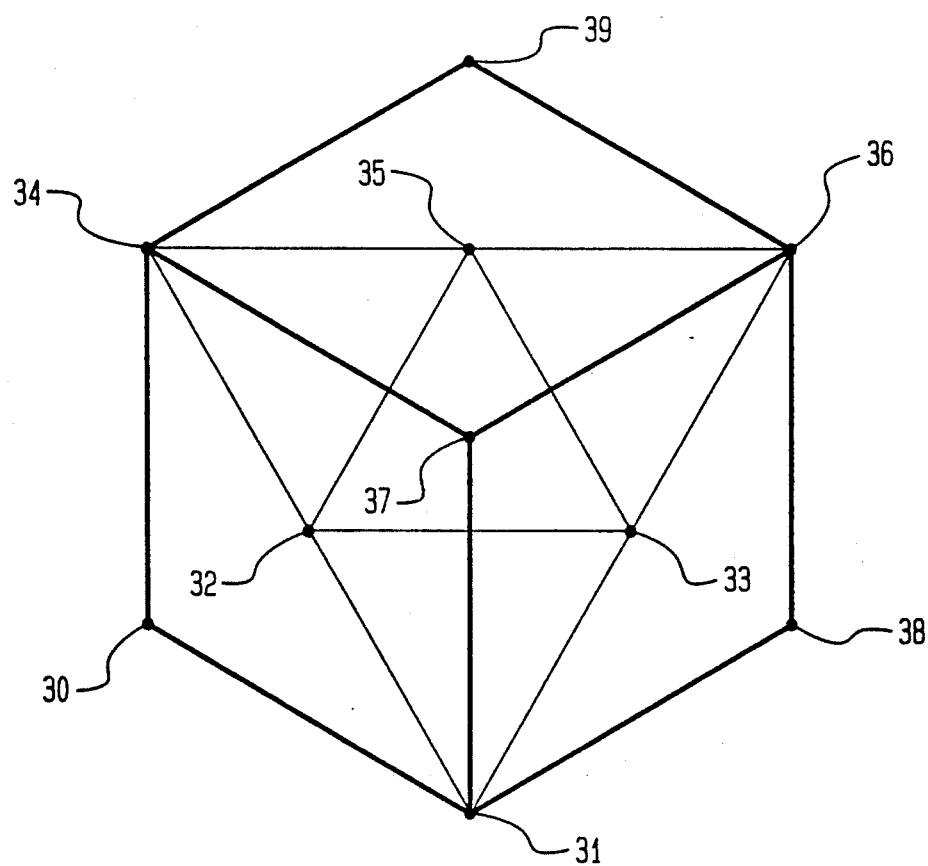
FIG. 3 is a perspective geometric representation of face-centered cubic lattice sites.

For the sake of relating a preferred structure to an alternative representation, FIG. 3 shows selected lattice sites 30-39 of a face-centered cubic structure. Sites 31-36 are readily seen to lie in a plane and to form a regular triangular array as shown also in FIG. 1; sites 30, 38, and 39 lie in a parallel plane below. Unit cells in accordance with FIG. 2 are centered on such sites.

When suitably dimensioned, a preferred structure has a "forbidden band" of wavelengths at which it can serve as an omnidirectional reflector; also, within the structure, electromagnetic radiation at such wavelengths is inhibited. For example, for a material having a refractive index of 3.6, a triangular pattern with hole sites spaced apart 0.3062" (0.7777 centimeter), and a hole diameter of 13/64" (0.5159 centimeter), the forbidden frequency band extends from 13 to 16 gigahertz approximately, corresponding to wavelengths from 1.9 to 2.3 centimeters approximately.

Among parameters available for influencing the optical properties of a preferred structure are the refractive index of the material of body 11, the shape, spacing, and size of the holes, and the refractive index of the medium occupying the holes. For example, for maximized fractional width of the forbidden band, optimal hole size depends on the refractive index of the material of body 11.

The material of body 11 may be homogeneous or inhomogeneous; e.g., as illustrated by the laser device of FIG. 6 below, body 11 may include an "island layer" whose composition differs from the surrounding material. Also, body 11 may be compositionally layered or graded. Preferred materials are chosen to be essentially transparent or nonabsorbing for a wavelength in the forbidden band; suitable materials include semiconductor materials, e.g., silicon, gallium arsenide, and indium phosphide, and dielectric materials, e.g., diamond and titanium dioxide. In the interest of a large refractive-index difference relative to the structural material, holes may be left unfilled; alternatively, the average refractive index of the structure can be influenced, e.g., by filling the holes with a suitable resin.

With circular shape of sites 13, etched holes will have elliptical cross section. For round holes, suitably shaped elliptical sites can be used, separate masks being required for processing in each of the three directions. Holes may also have straight-edged shapes, e.g., hexagonal or six-sided star shape. Typical hole size is such as to result in removal of at least 10 percent of the volume of an initial body. On the other hand, hole size is limited by considerations of structural integrity of the processed structure, so that, preferably, volume removed constitutes not more than approximately 90 percent of initial volume.

Figure 4:
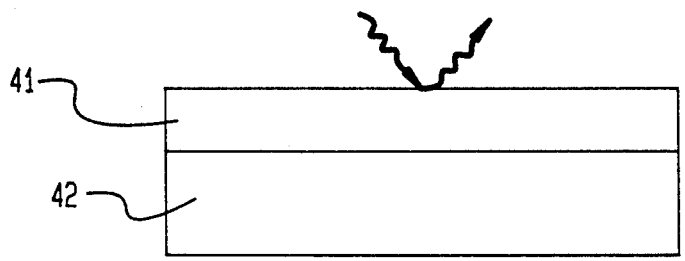
FIG. 4 is a schematic cross section of a preferred device embodiment of the invention.

FIG. 4 shows a preferred structure 41 on support body 42, e.g., for use as an omnidirectional external mirror. Support body 42 may serve as mounting and positioning means.

Figure 5:
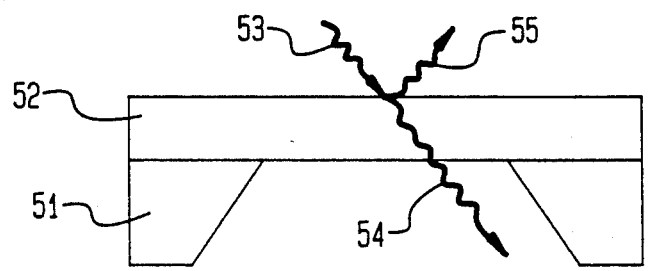
FIG. 5 is a schematic cross section of a preferred further device embodiment of the invention.

FIG. 5 shows a preferred structure 52 partially supported by support body 51 which may have been shaped by etching before or after formation of structure 52 as described above with reference to FIG. 1. The resulting assembly can be used as an optical filter: incident radiation 53 is transmitted (54) except for radiation 55 having wavelengths in the forbidden band of structure 52.

Figure 6:
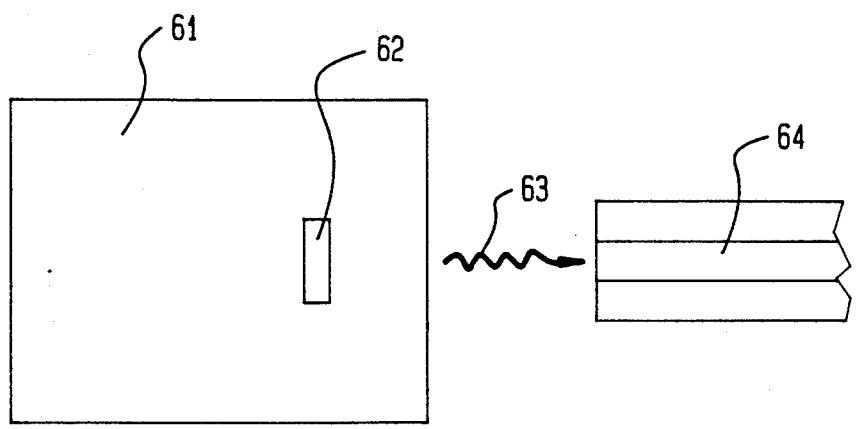
FIG. 6 is a schematic perspective representation of a laser structure, representing a preferred further device embodiment of the invention.

FIG. 6 shows optical gain medium 62 embedded in a preferred reflector structure 61—inclusion of gain medium 62 resulting in an allowed mode of electromagnetic radiation within an otherwise forbidden band of reflector structure 61. When suitably pumped, this assembly can operate as a laser and emit radiation 63 into optical communications fiber 64. Radiation 63 may be directly (electrically) modulated as in an optical communications transmitter; in accordance with an aspect of the invention, a resulting transmitter has an improved signal-to-noise ratio.

I claim:

1. A structure for reflecting electromagnetic radiation, comprising a solid body including a plurality of intersecting, essentially straight passages, wherein said passages intersect in a plurality of intersection regions, said intersection regions being respectively arranged on the three-edged corners of a cube and in centers of the faces of said cube, whereby said solid body has face-centered-cubic structure.

2. The structure of claim 1, said plurality of passages consisting of first, second, and third sets of mutually parallel passages.

such that, for a predetermined essentially planar, regularly triangular array of sites, each site is traversed by first, second, and third passages included in respective first, second, and third sets, such that first, second, and third passages form polar angles which are essentially equal to $\tan^{-1} 2^{-\frac{1}{2}}$ with a direction perpendicular to the plane of said array, and such that, for passages passing through a site of said array, the azimuthal angles between first and second, second and third, and third and first passages are essentially equal to 120 degrees.

3. The structure of claim 2 in which said polar angles are essentially equal to 35.26 degrees.

4. The structure of claim 1, said passages having essentially elliptical cross section.

5. The structure of claim 1, said passages having essentially hexagonal cross section.

6. The structure of claim 1, said passages having essentially star-shaped cross section.

7. The structure of claim 1, the combined volume of said passages in said solid body being greater than or equal to 10 percent by volume.

8. The structure of claim 1, the combined volume of said passages in said solid body being less than or equal to 90 percent by volume.

9. The structure of claim 1, said passages being essentially empty.

10. The structure of claim 1, said passages comprising a resin.

11. A device comprising a reflector structure for reflecting electromagnetic radiation, and positioning means for positioning said structure, said reflector structure comprising a solid body including a plurality of intersecting, essentially straight passages, wherein said passages intersect in a plurality of intersection regions, said intersection regions being respectively arranged on the three-edged corners of a cube and in centers of the faces of said cube, whereby said solid body has face-centered-cubic structure.

12. The device of claim 11 in which said positioning means supports said reflector structure at least in part.

13. The device of claim 12 in which said positioning means fully supports said reflector structure.

14. The device of claim 11, further comprising means for making electromagnetic radiation incident on said reflector structure.

15. The device of claim 11, further comprising means for generating electromagnetic radiation within said reflector structure.

16. A method for making a face-centered-cubic structure, comprising forming a plurality of intersecting, essentially straight passages in a solid body, said plurality of passages consisting of first, second, and third sets of mutually parallel passages such that, for a predetermined essentially planar, regularly triangular array of sites, each site is traversed by first, second, and third passages included in respective first, second, and third sets, such that first, second, and third passages form polar angles which are essentially equal to $\tan^{-1} 2^{-\frac{1}{2}}$ with a direction perpendicular to the plane of said array, and such that, for passages passing through a site of said array, the azimuthal angles between first and second, second and third, and third and first passages are essentially equal to 120 degrees.

17. The method of claim 16, forming said passages comprising machining.

18. The method of claim 16, forming said passages comprising microfabrication.

19. The method of claim 18, microfabrication comprising processing in the presence of a mask.

20. The method of claim 18, microfabrication comprising direct writing.

21. An optical communications method comprising modulating a laser with a signal to be transmitted, said laser comprising an optical gain medium and an optical reflector structure which is disposed adjacent to said optical gain medium and which comprises a solid body including a plurality of intersecting, essentially straight passages, wherein said passages intersect in a plurality of intersection regions, said intersection regions being respectively arranged on the three-edged corners of a cube and in centers of the faces of said cube, whereby said solid body has face-centered-cubic structure.

22. The method of claim 21 in which said laser is modulated by modulation of pump energy.

23. An electromagnetic reflector, comprising:

a body;

a first set of passages passing throughout a region of said body, arrange din a planar triangular array when penetrating a plane, and extending in parallel to each other and at a first angle of substantially 35.26° from an axis;

a second set of passages passing throughout said region of said body, arranged in said planar triangular array when penetrating said plane, and extending in parallel to each other, at said first angle from said axis, and at a second angle from said first set of passages; and a third set of passages passing throughout said region of said body, arranged in said planar triangular array when penetrating said plane, and extending in parallel to each other, at said first angle from said axis, and at said second angle from said first and said second sets of passages;

wherein said first, second, and third sets of passages comprise a refractive index different from that of said body.

* * * * *

UNITED STATES PATENT AND TRADEMARK OFFICE
CERTIFICATE OF CORRECTION

PATENT NO. : 5,172,267

DATED : December 15, 1992

INVENTOR(S) : Eli Yablonovitch

It is certified that error appears in the above-identified patent and that said Letters Patent is hereby corrected as shown below:

In the Abstract, line 4, change "Conventiently" to read --Conveniently--.
Column 6, line 2, change "arrange din" to read --arranged in--.

Signed and Sealed this

Twenty-sixth Day of October, 1993

Attest:

BRUCE LEHMAN

Attesting Officer

Commissioner of Patents and Trademarks